United States Patent [19]
Schneider-Hufschmidt et al.

[11] Patent Number: 6,130,628
[45] Date of Patent: Oct. 10, 2000

[54] DEVICE FOR INPUTTING ALPHANUMERIC AND SPECIAL SYMBOLS

[75] Inventors: Matthias Schneider-Hufschmidt; Rainer Volland, both of München, Germany

[73] Assignee: Siemens Aktiengesellschaft, Munich, Germany

[21] Appl. No.: 09/044,538

[22] Filed: Mar. 19, 1998

[30] Foreign Application Priority Data

Mar. 19, 1997 [DE] Germany .................... 197 11 486

[51] Int. Cl.[7] .................................... H03M 11/00
[52] U.S. Cl. .................... 341/26; 341/22; 341/23; 345/168; 379/368; 709/142; 709/145
[58] Field of Search ................ 341/20, 22, 23, 341/26; 708/145, 646, 142; 379/368; 345/168; 700/84

[56] References Cited

U.S. PATENT DOCUMENTS

| | | | |
|---|---|---|---|
| 4,007,443 | 2/1977 | Bromberg et al. | 708/145 |
| 4,202,038 | 5/1980 | Petersson | 708/145 |
| 5,007,008 | 4/1991 | Beers | 708/146 |
| 5,786,776 | 7/1998 | Kisaichi | 341/22 |
| 5,977,887 | 11/1999 | Grimmett | 341/26 |

*Primary Examiner*—Michael Horabik
*Assistant Examiner*—Albert K. Wong
*Attorney, Agent, or Firm*—Herbert L. Lerner; Laurence A. Greenberg; Werner H. Stemer

[57] ABSTRACT

In a keyboard with a restricted number of input keys, shifting between upper-case and lower-case character letters is effected with a key which is otherwise available for character or symbol entry. The upper case shift is accomplished by actuating a control element while observing a particular timing condition. Toggling the control element allows for comfortable caps shifting.

7 Claims, 1 Drawing Sheet

DEVICE FOR INPUTTING ALPHANUMERIC AND SPECIAL SYMBOLS

BACKGROUND OF THE INVENTION

1. Field of the Invention

The invention pertains to electronic entry keyboards. Entering text and/or numerical and/or special characters is often very tedious for the users of many small pieces of equipment, such as telephones, fax machines, small computers, and so forth. In mobile phones or cordless phones, for example, text characters are typically input by pressing certain number keys more than once; ASCII characters are assigned to the number keys in a standardized way (for instance by the ITU—International Telecommunications Union). Special characters are assigned to the 0, 1, * or # keys, for instance, or are added following the ASCII characters. Thus each key is assigned more than once. The "3" key, for instance, is assigned the character series {D E F 3 . . . }. Pressing the key once, twice, three times, etc. within a predetermined time period (or a time period that is adjustable by the user or the service technician), typically 800 ms, causes the character D, E, or F, etc. to be input.

Instead of pressing a key multiple times, depressing the key for a long time can also cause the characters to change over time in an autoscrolling process. Other versions are based on cursor keys, with which the intended characters can be selected from the entire linearly arranged alphabet or some other character set.

Special problems often arise when shifting from upper- to lower-case writing (or vice versa) while texts are being input (for instance in a Short Message Service), or when entering names (electronic telephone book in a communications terminal). In most mobile phones, the switchover (shift key function) between upper-case and lower-case writing is accomplished in one of the following ways:

In one prior art concept, the shift key function is effected with a so-called soft key or a dedicated key. The shift is then usually permanent, i.e., it is equivalent to the Caps Lock key on a PC keyboard. Due to the fact that only a few characters—often the first letter of a word—need to be entered in upper-case form, the Caps Lock mode is not very user-friendly. In another prior art concept, depressing a key for a prolonged time is used to shift from upper-case to lower-case. This leads to frequent typographical errors. A third prior art version places the capital letters after the lower-case letters in the multi-character series on each key, which makes for very time-consuming entering procedures.

SUMMARY OF THE INVENTION

It is accordingly an object of the invention to provide a keyboard system for inputting alphanumeric and special symbols, which overcomes the above-mentioned disadvantages of the prior art devices and methods of this general type and which is improved in this respect in that the shift between upper-case and lower-case key entry is made as simple as possible.

With the foregoing and other objects in view there is provided, in accordance with the invention, an electronic input device, comprising:

a plurality of input keys for selectively entering alphanumeric characters and special characters;

the plurality of input keys including a first control element and at least one second control element having a set of characters assigned thereto;

the first control element, upon being actuated once within a given time period, effecting a selection from the set of characters assigned to the second control element; and the first control element, upon being actuated more than once within the given time period, acting as a character input key.

The given time period may be predetermined or adjustable.

In accordance with an added feature of the invention, the first control element is a toggle key (e.g. a shift key) which, upon actuation, sets a subsequent actuation of the second control element within the given time period to a given character set (e.g. upper-case letters instead of lower-case).

In accordance with another feature of the invention, a single or plural actuation of the second control element within the given time period effects an input of characters, and wherein, depending on a number of times the control element is actuated within the given time period, a different character from the character set assigned to the control element is input.

In accordance with a concomitant feature of the invention, the second control element is adjusted such that a prolonged depression thereof causes automatic scrolling through a sequence of the multiple characters in the set of characters assigned to the second control element until the second control element is released.

In other words, the device has control elements assigned one and/or more than one character. When the first control element is actuated once within a predetermined or adjustable time period, then a second control element to be pressed subsequently is set to a given selection from the character set assigned to the second control element. If the first control element is actuated more than once, or held down for a prolonged time, within this time period, the first control element (BE1) acts as a character input key.

It is thus possible for the user of the device to enter text characters and other characters in a very comfortable and easily learned way, and to shift effortlessly between upper-case and lower-case writing.

Other features which are considered as characteristic for the invention are set forth in the appended claims.

Although the invention is illustrated and described herein as embodied in a keyboard system for inputting alphanumeric and special symbols, it is nevertheless not intended to be limited to the details shown, since various modifications and structural changes may be made therein without departing from the spirit of the invention and within the scope and range of equivalents of the claims.

The construction of the invention, however, together with additional objects and advantages thereof will be best understood from the following description of the specific embodiment when read in connection with the accompanying drawing.

DESCRIPTION OF THE PREFERRED EMBODIMENT

Figure 1:
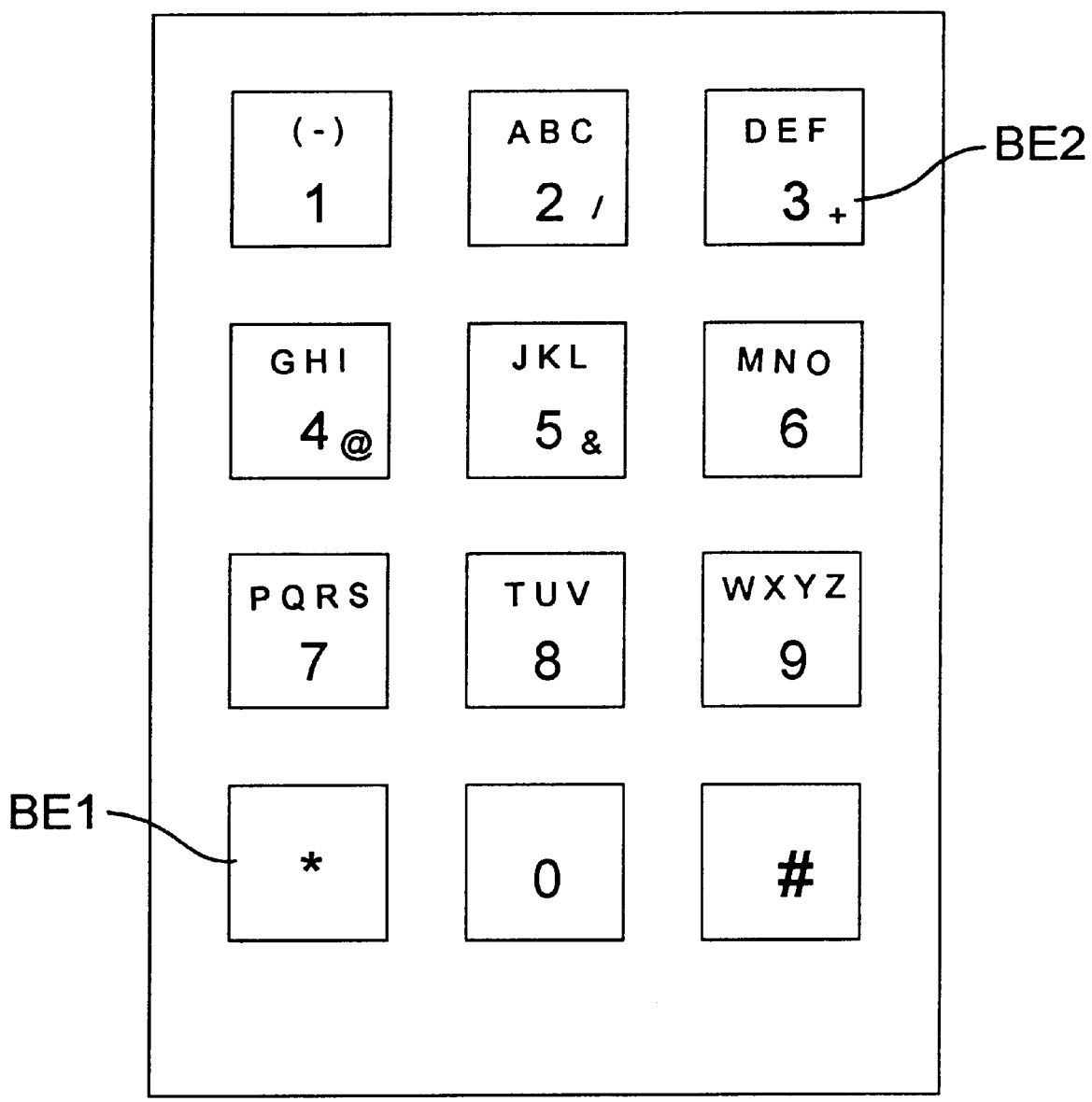
FIG. 1 is a plan view onto a telecommunications keyboard.

Dedicated and variable key assignment in electronic data input keyboards is well known to those of skill in the art. Accordingly, the device according to the invention is illustrated and described in a simple format with regard to an otherwise conventional telecommunications keyboard. The transfer and utilization of the novel concept for other data input terminals is well within the skill in the pertinent art. The device has at least one control element BE1. Here, the key has been selected as the control element BE1. When the control element BE1 is actuated once within a predetermined or adjustable time period, then a selection is made from the character set assigned to a second control element BE2 which is to be pressed subsequently. Here, one of the characters assigned to the "3" key is to be input and, accordingly, that key is identified as the second control element BE2. Conversely, this first control element BE1 acts as a (conventional) character input key, if it is actuated more than once within this time period. In other words, if, in the instant case, an asterisk is to be input, the key need only be depressed twice within, say, 800 ms.

In the preferred exemplary embodiment of the invention, pressing the * key down once means that the next character entered will be an upper-case character, if the next character entered can be written in upper case. As a rule, this is true only for text characters, i.e., letters. Pressing the * key twice or more during the predetermined time period, conversely, causes symbols, such as the "*", "/", "(", or "@" symbols, and so forth, to be input. Since for these special character symbols there is no defined upper case (and hence no need for an upper case), problems in this regard are precluded.

The fundamental concept of the present invention is accordingly to make joint use of a character input key as a selector and as a shift key. As a result, there is no need for a dedicated key and, accordingly, space and additional structural circuitry is saved. The concept is realized by measuring the time until the next actuation of the key. If the * key is pressed once by mistake, the mistake can be undone by pressing the same key again, once.

We claim:

1. An electronic input device, comprising:

a plurality of input keys for selectively entering alphanumeric characters and special characters;

said plurality of input keys including a first control element and at least one second control element having a set of characters assigned thereto;

said first control element, upon being actuated once within a given time period, effecting a selection from the set of characters assigned to said second control element; and said first control element, upon being actuated more than once within the given time period, acting as a character input key.

2. The device according to claim 1, wherein the given time period is adjustable.

3. The device according to claim 1, wherein the given time period is a predetermined time period.

4. The device according to claim 1, wherein said first control element is a toggle key which, upon actuation, sets a subsequent actuation of said second control element within the given time period to a given character set.

5. The device according to claim 1, wherein said first control element is a shift key which, upon actuation, sets a subsequent actuation of said second control element capital letters instead of lower-case letters.

6. The device according to claim 4, wherein a single or plural actuation of said second control element within the given time period effects an input of characters, and wherein, depending on a number of times said control element is actuated within the given time period, a different character from the character set assigned to said control element is input.

7. The device according to claim 1, wherein said second control element is adjusted such that a prolonged depression thereof causes automatic scrolling through a sequence of the multiple characters in the set of characters assigned to said second control element until said second control element is released.

* * * * *